United States Patent [19]
Bharthulwar

[11] Patent Number: 5,847,904
[45] Date of Patent: Dec. 8, 1998

[54] MAGNETORESISTIVE DEVICE INCORPORATING CONDUCTOR GEOMETRY PROVIDING SUBSTANTIALLY UNIFORM CURRENT FLOW FOR IMPROVED MAGNETIC STABILITY

[75] Inventor: Shridhar Bharthulwar, Boulder, Colo.

[73] Assignee: Quantum Peripherals Colorado, Inc., Louisville, Colo.

[21] Appl. No.: 569,674

[22] Filed: Dec. 8, 1995

[51] Int. Cl.$^6$ ........................................ G11B 5/39
[52] U.S. Cl. ................................................ 360/113
[58] Field of Search ...................................... 360/113

[56] References Cited

U.S. PATENT DOCUMENTS 5,555,147  9/1996  Maruyama ........................ 360/113
5,557,492  9/1996  Gill ................................... 360/113

*Primary Examiner*—A. J. Heinz
*Attorney, Agent, or Firm*—William J. Kubida; Holland & Hart LLP

[57] ABSTRACT

A magnetoresistive ("MR") device incorporating an improved conductor geometry to provide enhanced magnetic stability by providing essentially uniform current flow through the device active region in order to effectively obviate the formation of undesired domain walls, particularly during read back operations. A pair of current conductors are provided in electrical contact with the magnetoresistive device and configured to provide current to the magnetoresistive device at an angle of less than 90° to the easy axis.

42 Claims, 6 Drawing Sheets

MAGNETORESISTIVE DEVICE INCORPORATING CONDUCTOR GEOMETRY PROVIDING SUBSTANTIALLY UNIFORM CURRENT FLOW FOR IMPROVED MAGNETIC STABILITY

CROSS REFERENCE TO RELATED APPLICATIONS

The present invention is related to the subject matter of U.S. Pat. No. 5,435,334 issued Feb. 16, 1996 (application Ser. No. 08/392,393 filed Feb. 22, 1995) for "Magnetoresistive Device and Method Having Improved Barkhausen Noise Suppression" and U.S. patent application Ser. No. 08/461,874 filed Jun. 5, 1995 for "Soft Adjacent Layer Biased Magnetoresistive Device Incorporating a Natural Flux Closure Design Utilizing Coplanar Permanent Magnet Thin Film Stabilization" (now U.S. Pat. No. 5,532,892) and Ser. No. 08/401,553 filed Mar. 9, 1995 for "Shaped Spin Valve Type Magnetoresistive Transducer and Method for Fabricating the Same Incorporating Domain Stabilization Technique". The foregoing patent and patent applications are assigned to Quantum Peripherals Colorado, Inc., Louisville, Colo., the disclosures of which are hereby specifically incorporated by this reference.

BACKGROUND OF THE INVENTION

The present invention relates, in general, to the field of magnetoresistive ("MR"), giant magnetoresistive ("GMR") and spin-valve ("SV") sensors. More particularly, the present invention relates to an improved electrical conductor geometry for MR sensors providing for improved magnetic domain stability, reduced Barkhausen noise and increased reliability of operation without necessitating any additional processing steps in implementation.

Magnetoresistive sensors are known to be useful in reading data from a magnetic surface with a sensitivity exceeding that of inductive or other thin film heads. In operation, an MR sensor is used to detect magnetic field signal changes as a function of the direction and amount of magnetic flux being sensed. It is also known that for an MR sensor to function effectively, it must be subjected to a transverse bias field to linearize its response. Various techniques for effectuating such transverse biasing are known, including current shunt, "barber pole" and soft adjacent film biasing. The transverse bias field is applied normal to the plane of the magnetic media and parallel to the surface of the MR sensor.

It is also known that an MR sensor may be utilized in conjunction with a longitudinal bias field extending parallel to the surface of the magnetic media and parallel to the major axis of the MR sensor. Stabilization of MR sensors by means of a longitudinal bias field is necessary for their application in high track density disk drives in order to suppress Barkhausen noise. Barkhausen noise results from unstable magnetic properties such as multi-domain states (or domain walls) within the MR element which may appear, for example, following a magnetic disturbance from an associated write head or other external magnetic field source.

In this regard, magnetoresistive and spin valve magnetic recording "read" elements are commonly stabilized with antiferromagnetic ("AF") materials such as ferromanganese ("FeMn") or a permanent magnet ("PM") layer comprising cobalt platinum ("CoPt"), cobalt platinum tantalum ("CoPtTa") or cobalt platinum chromium ("CoPtCr") in order to pin the off-track boundaries and obtain a single magnetic domain state throughout the active MR element. However, the effectiveness of such boundary bias approaches diminishes in the center of the active region due to the fact that the flux rapidly leaks out of the active MR region as the distance to the boundary increases. This undesired flux leakage is one common cause of multi-domain states and associated Barkhausen noise on read back resulting in concomitant instability problems.

In conjunction with these previous approaches directed toward obviating the formation of domain walls, none have heretofore addressed the current flow pattern in the MR active region which is also a significant contributing factor in the formation of multi-domain states particularly during a read back operation or in operation in the presence of stray magnetic fields. Conventional conductor designs induce a 90° turn in the current through the MR device active region resulting in a non-uniform current flow and increased likelihood of domain wall, or multi-domain state, formation.

SUMMARY OF THE INVENTION

The conductor geometry disclosed herein improves the magnetic stability of MR, GMR and SV heads by modifying the current flow pattern in the active region of the MR structure. This is accomplished in a preferred embodiment by moving a portion of the medial edge of a conventional conductor pattern laterally of the device active region resulting in a more streamlined and uniform current pattern. This improved current pattern minimizes domain wall formation in the MR structure and results in more stable device performance, particularly during read back operations and in the presence of stray magnetic fields.

Specifically disclosed herein is a magnetoresistive device comprising a magnetoresistive layer having an active region thereof and at least one conductor having a proximal end thereof electrically coupled to the active region of the magnetoresistive layer and a distal end thereof extending primarily longitudinally from the active region. In a particular embodiment, the conductor width is lesser at the proximal end than at the distal end.

Further specifically disclosed herein is a magnetoresistive device comprising a magnetoresistive structure having an active region thereof forming at least a portion of a magnetoresistive layer. At least one conductor is in electrical contact with the magnetoresistive structure with the conductor presenting opposing medial and lateral edges thereof and wherein at least a portion of the medial edge is displaced laterally of the active region.

Also further disclosed herein is a magnetoresistive device comprising a magnetoresistive layer presenting an easy axis extending longitudinally of an active region, a soft adjacent layer underlying the magnetoresistive layer for providing a transverse bias thereto and a magnetic spacing layer interposed between the magnetoresistive and the soft adjacent layer. First and second current conductors are provided in electrical contact with the magnetoresistive device and configured to provide current to the magnetoresistive device at an angle of less than 90° to the easy axis.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein.

DESCRIPTION OF A PREFERRED EMBODIMENT

Figure 1:
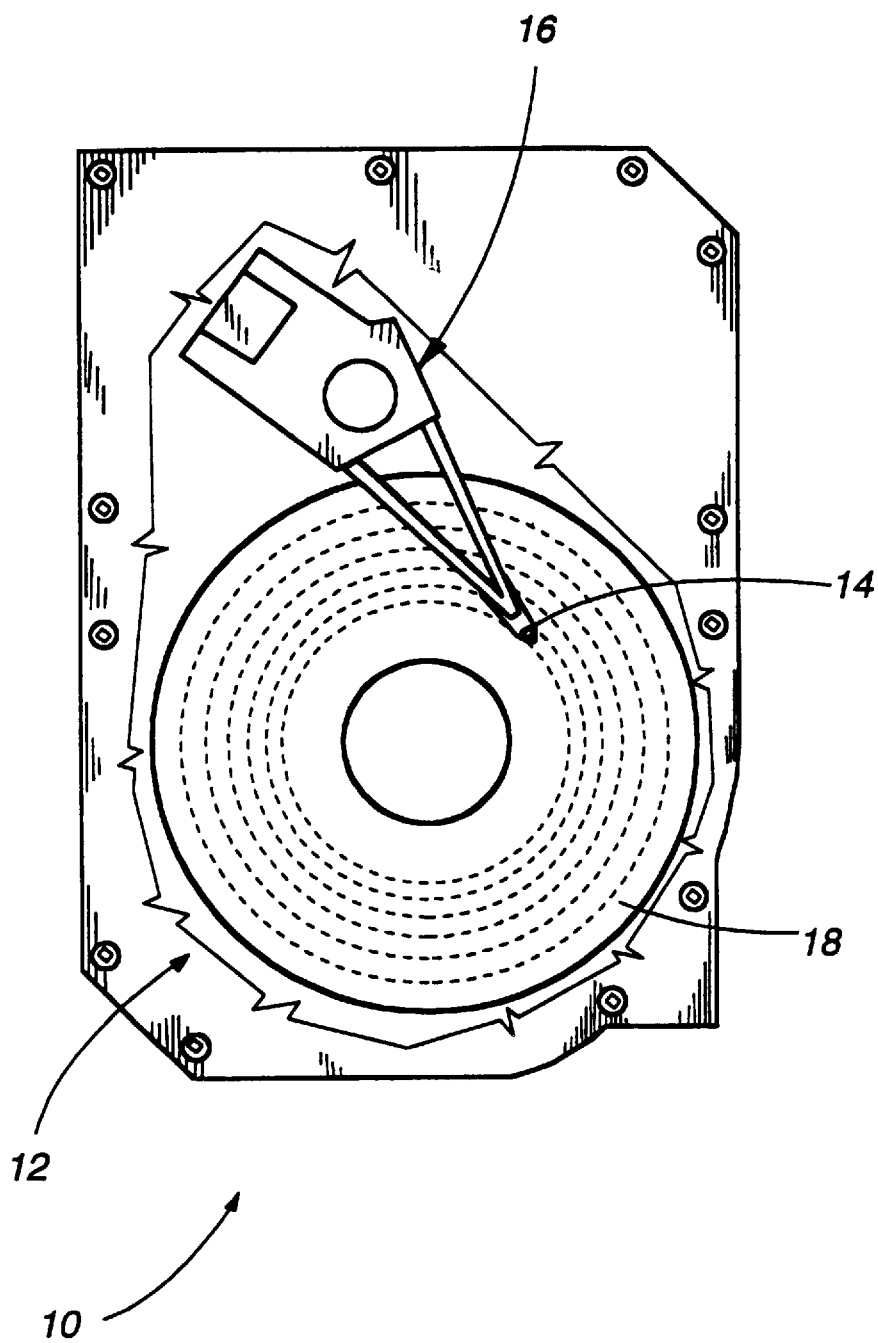
FIG. 1 is a simplified, cut-away, top plan view of a conventional disk drive constituting one application of a magnetoresistive sensor of the present invention as a magnetic "read" head.

With reference now to FIG. 1, a simplified, cut-away, top plan view of a disk drive 10 is shown for possible use in conjunction with the MR sensor of the present invention. The disk drive 10 comprises, in pertinent part, a number of disks 12 which are rotated about a central axis. A read/write head 14, which may include an MR sensor in accordance with the present invention as a "read" element, is positioned by means of a positioner 16 with respect to a number of concentric data tracks on the surfaces 18 of the disks 12 to enable data to be written to, or read from, the magnetically hard surfaces 18 thereof.

Magnetic instability in previous MR heads primarily arises due to magnetic domain formation in the active MR element (also referred to as Barkhausen noise) and results in sudden amplitude and baseline jumping in the readback waveform. This can adversely affect the servo positioning feedback system of the positioner 16 and more seriously the data error rate in the read channel of the disk drive 10. In other words, it seriously affects the disk drive's ability to correctly position the read/write head 14 over the recorded data on the surfaces 18 of the disks 12 and reliably read the recorded data. Hence, it can lead to a total failure of the disk drive 10 operation.

Figure 2A:
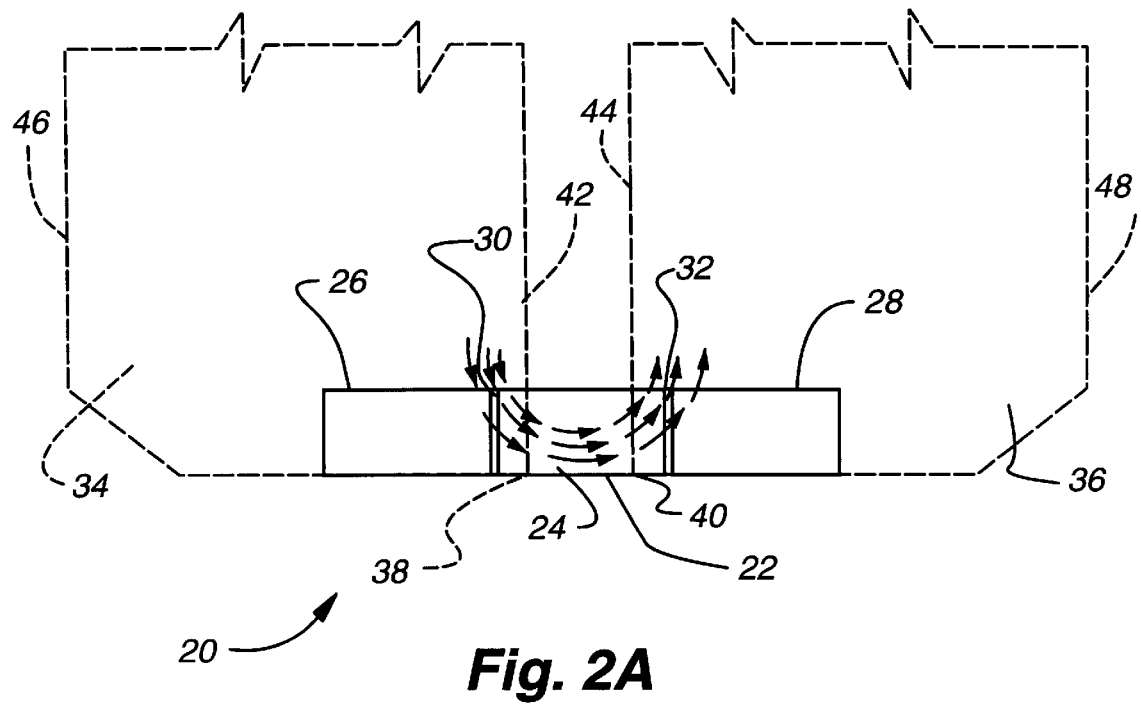
FIG. 2A is a partial top plan view showing a conventional conductor geometry (in phantom) for a magnetoresistive device wherein the current flow pattern is indicated as having to traverse a substantially 90° path at each end of the MR active region.

With reference now to FIG. 2A, a conventional conductor geometry for utilization with an exemplary MR device is shown. The conventional MR device 20, as shown, comprises an MR sensor 22 which may be utilized, for example, as a "read" head in a magnetic disk drive.

The MR sensor 22 of the conventional MR device 20 includes an MR layer active region 24 as shown as well as, in this exemplary embodiment, a pair of longitudinal bias elements 26, 28 disposed adjacent opposing ends of the MR layer active region 24. The longitudinal bias elements 26, 28 may comprise, for example, permanent magnet elements as disclosed in the foregoing United States Patent and Patent Applications.

As also disclosed in the foregoing Patent and Patent Applications, separation layers 30, 32 may be interposed between the longitudinal bias elements 26, 28 respectively and the MR layer active region 24.

Also illustrated are conventional conductors 34, 36 which partially overlie and contact the MR layer active region 24. In this regard, it can be seen that the conventional conductors 34, 36 also include a right angled corner 38, 40 respectively in the region of the MR layer active region 24.

Additionally, it can be seen that the conventional conductors 34, 36 include straight medial edges 42, 44 extending from the corners 38, 40 respectively and generally parallel and opposing lateral edges 46, 48 respectively.

Figure 2B:
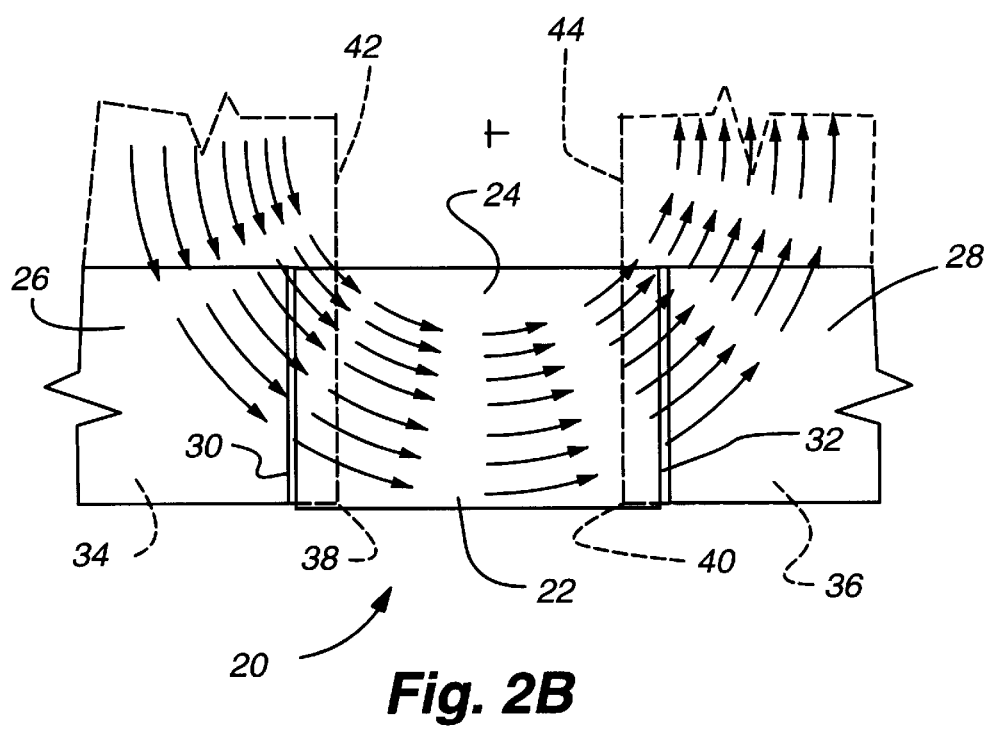
FIG. 2B is an enlarged top plan view of the MR layer of the magnetoresistive device of FIG. 2A illustrating in greater detail the substantially non-uniform current flow pattern through the device active region which increases the likelihood of undesired domain wall formation and concomitant Barkhausen noise.

With additional reference now to FIG. 2B, an enlarged top plan view of that portion of the conventional MR device 20 shown in FIGS. 2A is shown to further illustrate the substantially right angled turn the current delivered to the MR sensor 22 by means of the conventional conductors 34, 36 must traverse by virtue of the straight medial edges 42, 44 and resultant right angled corners 38, 40. By virtue of the substantially 90 degree turn the current must make at each of the medial edges 42, 44 of the conventional conductors 34, 36 respectively, a greater likelihood of domain wall formation is encountered due to this non-uniform current flow.

Figure 2C:
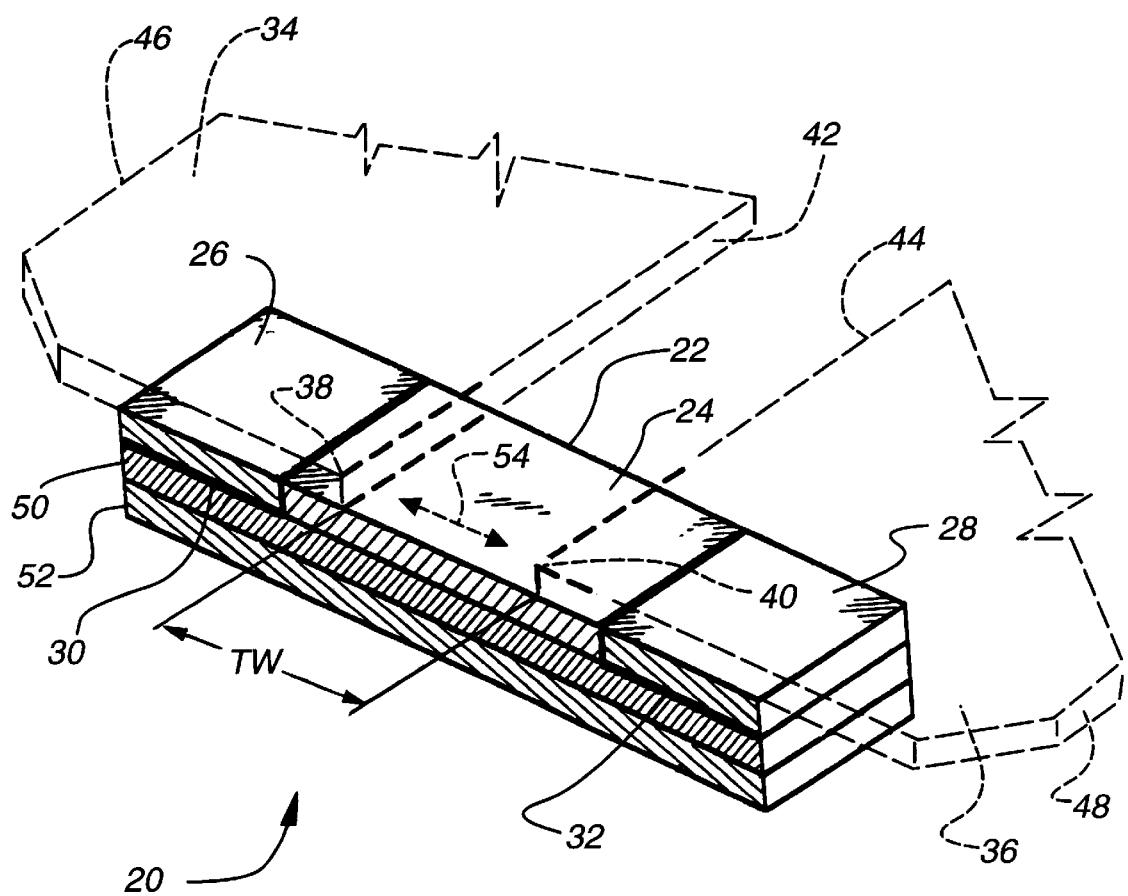
FIG. 2C is an isometric view of the conventional conductor geometry (shown in phantom) of the magnetoresistive device of FIGS. 2A–2B further illustrating the MRS structure of an MR sensor in accordance with the foregoing United States patent.

With additional reference now to FIG. 2C, an isometric view of the conventional MR device 20 illustrated in the preceding FIGS. 2A–2B is shown. In this view, it can be seen that the MR layer active region 24 overlies a magnetic spacing layer ("MSL") 50 as well as an underlying soft adjacent layer ("SAL") 52 for providing transverse bias to the MR layer active region 24. As illustrated, the easy axis of the MR sensor 22 is indicated by line 54 extending substantially longitudinally of the conventional MR device 20. A track width ("TW") for the MR sensor 22 is set by the distance between the respective conventional conductors 34, 36 as well as the length of the MR layer active region 24.

Figure 3A:
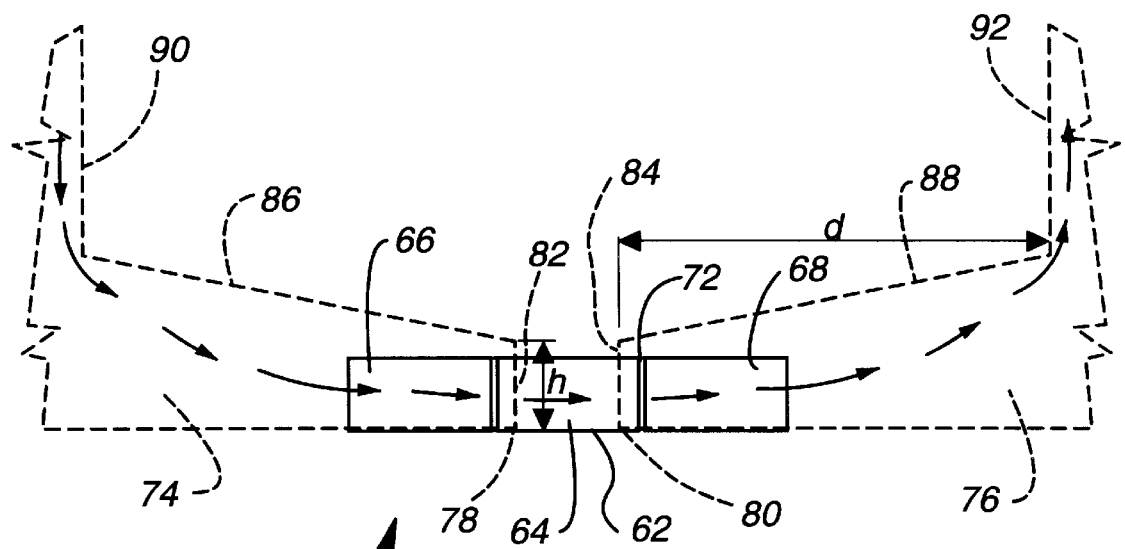
FIG. 3A is a partial top plan view showing an improved conductor geometry (in phantom) for a magnetoresistive device in accordance with the present invention wherein the current flow pattern is indicated as substantially uniform at each end of the MR active region and therethrough thus effectively precluding the formation of undesired domain walls.

With reference additionally now to FIG. 3A, an MR device 60 in accordance with the present invention is shown. MR device 60 comprises an MR sensor 62 having an MR layer active region 64. In the embodiment illustrated, the MR layer active region 64 may comprise between substantially 200–500 Å of NiFe or other suitable ferromagnetic material.

In accordance with the teachings of the aforementioned United States Patent and Patent Applications, a pair of longitudinal bias elements 66, 68 may be disposed adjacent the end portions of the MR layer active region 64 to provide a longitudinal bias thereto. In the embodiment illustrated, the longitudinal bias elements 66, 68 may comprise permanent magnet layers comprising CoPt, CoPtCr or CoPtTa. It should be noted that although the longitudinal bias elements 66, 68 are illustrated as permanent magnet layers, other conventional longitudinal bias techniques may be utilized in conjunction with the present invention including the use of antiferromagnets.

Also in accordance with the teaching of the aforementioned United States Patent and Patent Applications, a pair of separation layers 70, 72 may be interposed between the longitudinal bias elements 66, 68 respectively, and the end portions of the MR layer active region 64. The separation layers 70, 72 may comprise a non-magnetic metal such as Cr or, alternatively, a dielectric material such as aluminum oxide.

Also illustrated are the improved geometry conductors 74, 76 of the MR device 60. The improved geometry conductors 74, 76 overlie and contact the MR layer active region 64 although, it should be noted that in other applications, the improved geometry conductors 74, 76 may provide electrical contact to the MR device 60 by means of direct contact to the longitudinal bias elements 66, 68 when such are provided as PM elements.

The improved geometry conductors 74, 76 include a corner 78, 80 adjacent one edge of the MR layer active region 64 and present first medial edges 82, 84 having, as indicated, a height ("h"). The height "h" of the first medial edges 82, 84 of the improved geometry conductors 74, 76 respectively, may be exactly equal to the stripe height of the MR layer active region 64 (the width of the MR layer active region perpendicular to the easy axis) or slightly larger as illustrated. In a particular embodiment, "h" may be approximately equal to 5 $\mu$.

Improved geometry conductors 74, 76 also include a respective displaced edge 86, 88 coupling the first medial edges 82, 84 to respective second medial edges 90, 92. In this regard, although illustrated as substantially straight lines, the displaced edges 86, 88 may curve from the first medial edges 82, 84 to the respective second medial edges 90, 92 and still provide the benefits hereinafter described. The second medial edges 90, 92 are displaced from the first medial edges 82, 84 respectively, by a distance ("d"). In the embodiment illustrated, d may be substantially between 10 and 20 $\mu$ in length.

Figure 3B:
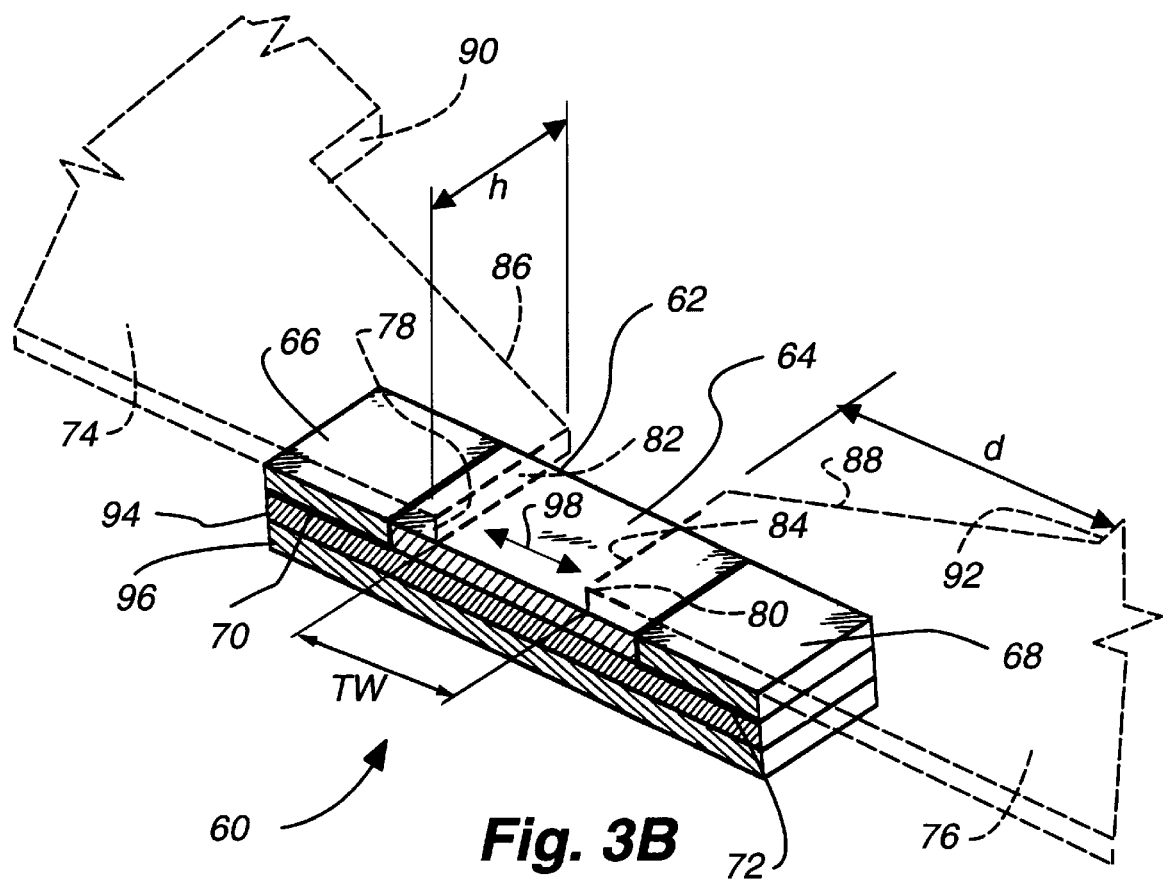
FIG. 3B is an isometric view of the improved conductor geometry of the present invention (shown in phantom) of the magnetoresistive device of FIG. 3A also illustrating the MRS structure thereof.

With reference additionally now to FIG. 3B, the MR device 60 of the preceding FIG. 3A is illustrated in an isometric view thereof to better illustrate the structure of the MR sensor 62. A magnetic spacing layer 94 of between approximately 100–250 Å of Ta may underlie the MR layer active region 64. Moreover, a soft adjacent layer 96 comprising between approximately 200–500 Å of NiFeMo may be utilized to provide a transverse bias to the MR layer active region 64. As illustrated, the easy axis 98 of the MR sensor 62 lies substantially longitudinally of the MR device 60.

As can be seen by reference to FIGS. 3A–3B, the current flow through the MR device 60 by virtue of the improved geometry conductors 74, 76 is substantially linear and uniform through the MR layer active region 64. In this manner, a more uniform current flow pattern is created thereby greatly minimizing the likelihood of domain wall formation within the MR device 60 and the concomitant production of Barkhausen noise. By altering the shape of the conductors to the MR device 60 as shown, the current flow pattern in the MR layer active region 64 becomes more streamlined and, hence, results in more stable device performance by improving its overall magnetic stability. This has been accomplished by making the first medial edges 82, 84 not colinear with the second medial edges 90, 92 and displacing the latter at a distance from the MR layer active region 64. In this manner, current flow may be directed to the MR layer active region 64 at an angle of less than 90 degrees thus distinguishing it from the conventional MR device 20 (FIGS. 2A–2C). By moving the current turning corner away from the MR layer active region 64, the maximum current density near the active area is reduced significantly. This, therefore, reduces the probability of a domain wall formation in the active area.

Figure 4A:
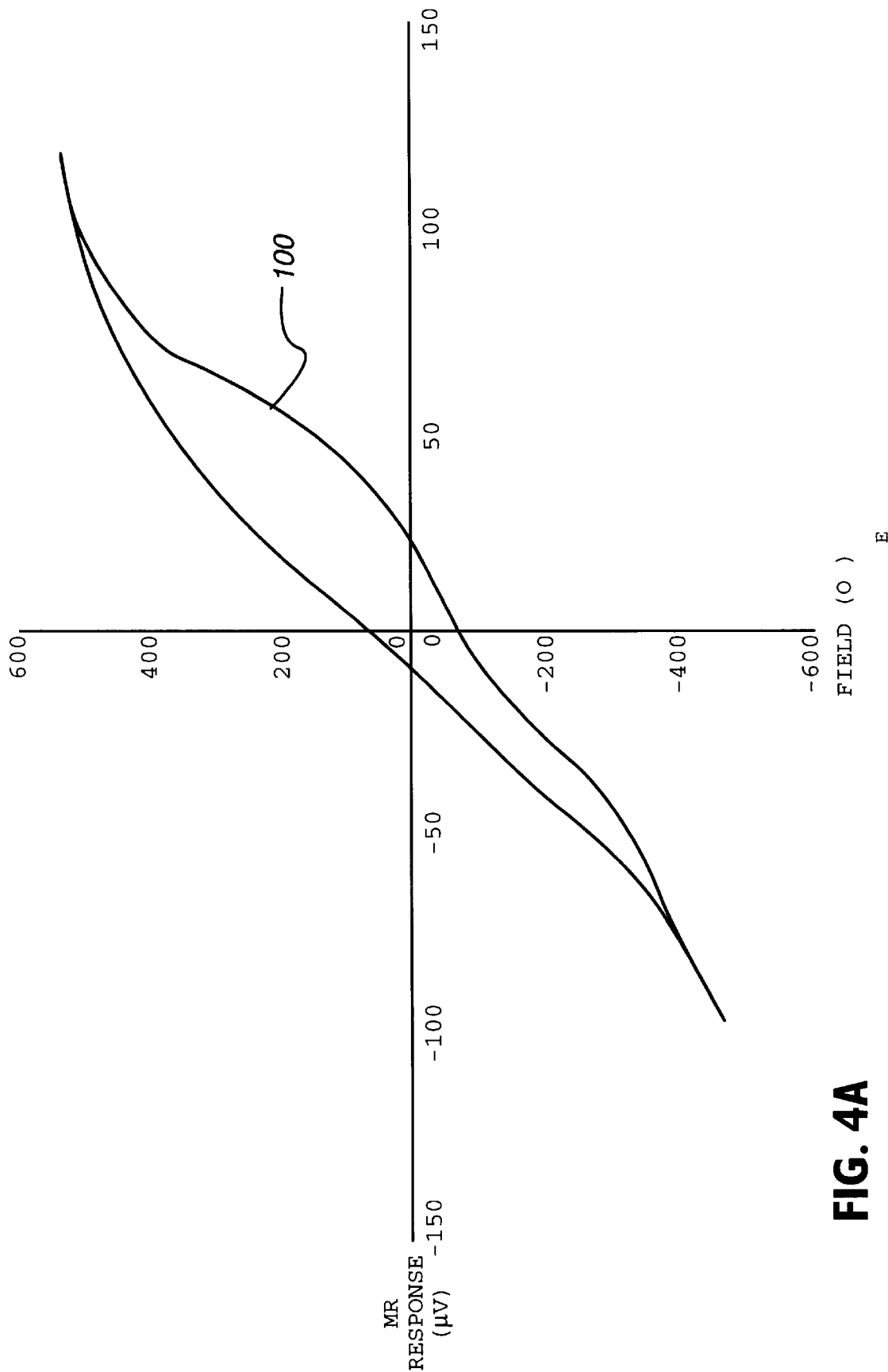
FIG. 4A is a graphical representation of the MR response transfer curve for the conventional conductor geometry illustrated in FIGS. 2A–2C in the presence of a 15 Oersted ("Oe") stray magnetic field.
Figure 4B:
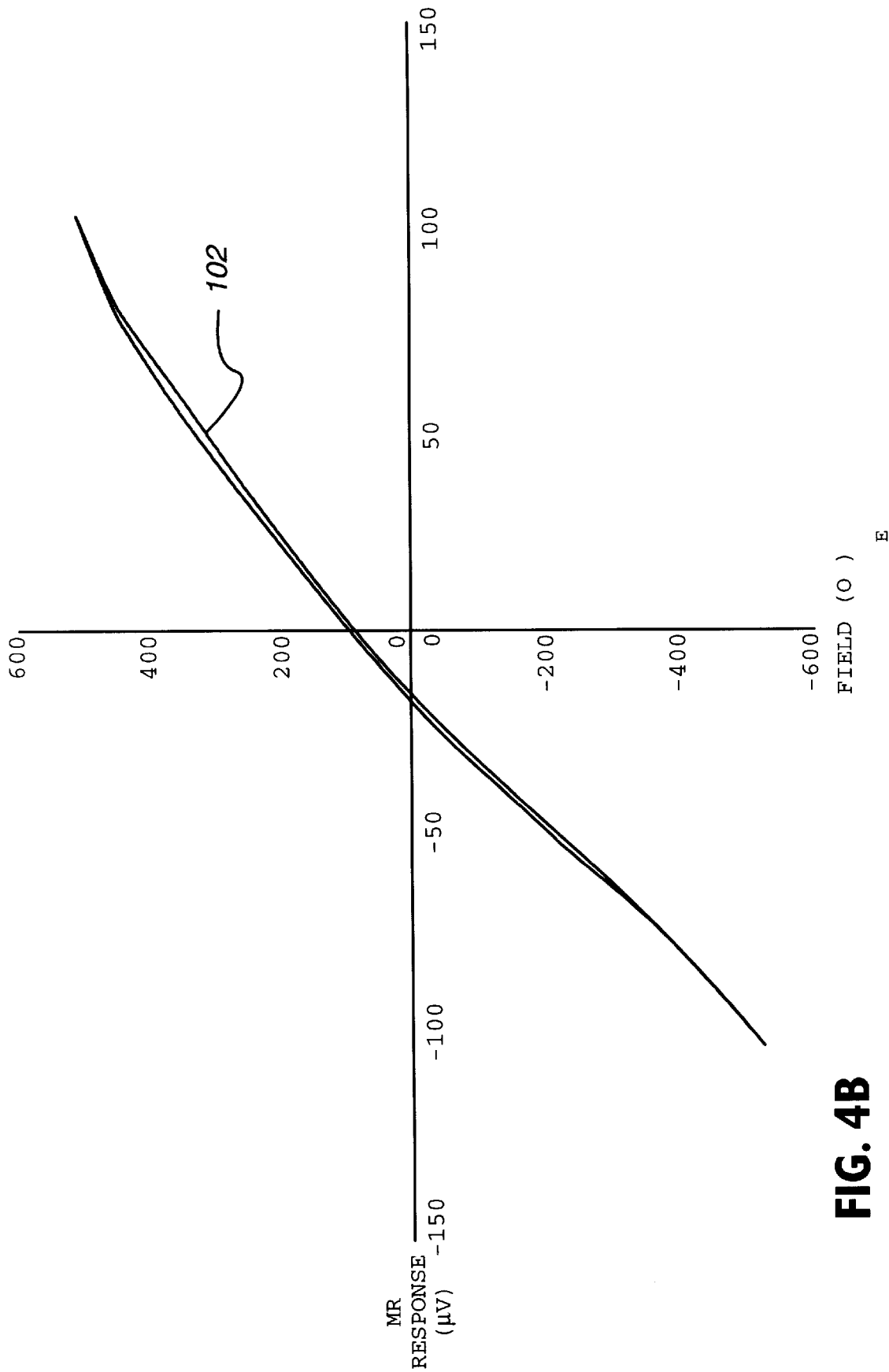
FIG. 4B is a further graphical representation of the MR response transfer curve for a magnetoresistive device utilizing the improved conductor geometry of the present invention illustrated, for example, in FIGS. 3A–3B in the presence of a stray field of like magnitude.

With reference additionally now to FIGS. 4A and 4B, a conventional transfer curve 100 for a conventional MR device 20 (FIGS. 2A–2C) as well as an improved transfer curve 102 for the MR device 60 (FIGS. 3A–3B) is shown. The conventional transfer curve 100 as well as the improved transfer curve 102 are plotted with respect to a field of between −150 to +150 Oersteds ("Oe") and indicates their response from between −600 to +600 microvolts.

Experimentally, a field of up to 100 Oe was utilized in order to stress the devices beyond what they might encounter from any accompanying magnetic media as an excitation field. In this manner, the devices will more readily exhibit the inherent differences in stability between the conventional MR device 20 and the MR device 60 of the present invention, even though a field of only approximately 50 to 60 Oe is required to simulate the amplitude generated by a media field.

As can be seen, the improved transfer curve 102 of the MR device 60 exhibits much less Barkhausen noise and generally exhibits a much more stable performance than the conventional transfer curve 100 of the conventional MR device 20. Significantly, the improved transfer curve 102 exhibits no Barkhausen noise even in the presence of a 15 Oe stray magnetic field applied opposing the direction of the longitudinal bias elements 66, 68 (FIGS. 3A–3B). Under similar conditions, the conventional MR device 20 showed considerable hysteresis in the conventional transfer curve 100 which is indicative of magnetic instability. In addition to a significant improvement in the overall magnetic stability characteristics of the MR device 60, the improved transfer curve 102 also indicates that this design is quite insensitive to easy axis stray fields as high as 15 Oe, thus implying better cross-track performance.

The HAMPster (a data analysis software for the transfer curves 100, 102 of FIGS. 4A–4B) data corresponding to the transfer curves 100, 102 is shown in the following Table 1. Table 1 compares the hysteresis percentage and derivative range percentage for the MR device 60 (FIGS. 3A–3B) as well as the conventional device 20 (FIGS. 2A–2C) and shows the significant performance enhancements in the presence of both a zero stray field as well as a 15 Oe stray field. The hysteresis percentage may be given as: [(area enclosed by the transfer curve)/(applied field range * total amplitude)]×100%. The derivative range may be given as: ([(slope)$_{max}$−(slope)$_{min}$]/total amplitude)×100% where (slope) is the derivative of the transfer curve with respect to the applied field. The derivative range is indicative of sudden jumps in the transfer curve and, hence, is a measure of Barkhausen noise.

TABLE 1

| | Hysteresis % | | Derivative Range % | |
| --- | --- | --- | --- | --- |
| | No stray field | 15 Oe stray field | No stray field | 15 Oe stray field |
| MR device 60 Avg | 1.74 | 1.6 | 1.025 | 1.1 |
| Std Dev | 0.40 | 0.375 | 0.1 | 0.126 |
| Conventional Avg | 2.86 | 3.68 | 1.23 | 1.64 |
| MR device 20 Std Dev | 0.80 | 1.53 | 0.421 | 0.71 |

It should also be noted that, experimentally, the resistance of the MR device 60 did not rise significantly due to the change in the shape of the improved geometry conductors 74, 76. This is due to the fact that, in the use of gold ("Au") for the improved geometry conductors 74, 76, such electrical conductors form a fairly small portion of the entire MR resistance of the MR device 60 and the reconfiguration of the conductors has a negligible effect on the overall MR resistance. Moreover, the MR device 60 incorporation of the improved geometry conductors 74, 76 also had no significant impact on the overwrite capability of the MR device 60 during a read back process. From experimental data, the overwrite appears to be independent of the design and on average was approximately 38 dB which is well within design tolerance.

While there have been described above the principles of the present invention in conjunction with a specific embodiment of a PM longitudinally biased magnetoresistive device, it should be clearly understood that the foregoing description is made only by way of example and not as a limitation to the scope of the invention. Particularly, the conductor geometry herein disclosed may be utilized in conjunction with GMR and SV devices as well as MR devices having longitudinal bias supplied by means of antiferromagnets and those utilizing transverse bias techniques other than SAL bias. The present invention may, for example, be advantageously utilized in disk drive heads, tape drive heads, helical scan tape heads (such as those used in VCRs) and other computer mass storage applications including dual stripe MR heads. which include a magnetoresistive film to sense magnetic field.

What is claimed is:

1. A magnetoresistive device, comprising:
    an elongated magnetoresistive layer having a centrally located active region;
    said active region having first and second longitudinally spaced ends, and said active region providing an easy axis that extends longitudinally of said active region between said first and second ends;
    an elongated soft adjacent layer underlying said magnetoresistive layer for providing a transverse bias;
    an elongated magnetic spacing layer underlying said magnetoresistive layer and interposed between said magnetoresistive layer and said soft adjacent layer, and
    first and second current conductors respectively physically overlying and in electrical contact with said first and second ends of said active region;
    said first and second conductors each having a first medial edge that overlies said first and second ends respectively of said active region;
    said first and second conductors each having a second medial edge that is non-colinear with a corresponding first medial edge and is physically displaced from said corresponding first medial edge in a direction away from a corresponding end of said active region;
    said first medial edge of each of said first and second conductors being substantially equal in length to a stripe height of said active region, as said stripe height is measured in a direction that is generally perpendicular to said easy axis; and
    said second medial edge of each of said conductors being displaced from a corresponding first medial edge by a distance that is at least two times greater than said stripe height.

2. The magnetoresistive device of claim 1 further comprising:
    first and second longitudinal biasing elements disposed coplanar with said magnetoresistive layer and respectively adjacent to said first and second longitudinally spaced ends of said magnetoresistive layer for providing a longitudinal bias thereto.

3. The magnetoresistive device of claim 2 further comprising:
    first and second separation layers respectively interposed between said first and second longitudinal biasing elements and said first and second ends of said magnetoresistive layer.

4. The magnetoresistive device of claim 3 wherein said first and second separation layers comprise a dielectric material.

5. The magnetoresistive device of claim 4 wherein said dielectric material comprises aluminum oxide.

6. The magnetoresistive device of claim 3 wherein said first and second separation layers comprise a non-magnetic metal.

7. The magnetoresistive device of claim 6 wherein said non-magnetic metal comprises Cr.

8. The magnetoresistive device of claim 1 wherein said magnetoresistive layer comprises NiFe, wherein said soft adjacent layer comprises NiFeMo, wherein said magnetic spacing layer comprises Ta, wherein said magnetic spacing layer comprises Ta, and wherein said first and second longitudinal biasing elements are selected from the group CoPt, CoPtCr and CoPtTa.

9. The magnetoresistive device of claim 8 further comprising:
    a head disk assembly;
    at least one magnetic storage media rotatably contained within said head disk assembly having data encodable thereon; and
    at least one positioner mechanism movably contained within said head disk assembly for positioning said magnetoresistive device with respect to said storage media to enable reading of selected portions of said data.

10. The magnetoresistive device of claim 1 wherein said first medial edges are substantially 5 $\mu$ in length, and wherein said second medial edges are each displaced from a corresponding first medial edge by a distance that is substantially between 10–20 $\mu$ in length.

11. A magnetoresistive device, comprising:
    a magnetoresistive structure having a generally elongated active region that forms a generally centrally located portion of an elongated magnetoresistive layer;
    said magnetoresistive layer having longitudinally spaced first and second ends;
    said active region having longitudinally spaced first and second ends that correspond respectively to said first and second ends of said magnetoresistive layer;
    said active region having an elongated easy axis that extends between said first and second ends of said magnetoresistive layer;
    a conductor in electrical contact with one of said ends of said active region;
    said conductor having a first medial edge that extends generally normal to said easy axis and physically overlaps a corresponding end of said magnetoresistive layer;
    said conductor having a second medial edge that is non-colinear with said first medial edge and is physically displaced from said first medial edge in a direction parallel to said easy axis and away from said one end of said active region;

said first medial edge being substantially equal in length to a stripe height of said active region as said stripe height is measured generally normal to said easy axis; and said second medial edge being physically displaced from said first medial edge by a distance that is in the range of from two to four times greater than said stripe height.

12. The magnetoresistive device of claim 11 wherein said first and second ends of said magnetoresistive layer include respective first and second end surfaces, and further comprising:

first and second longitudinal biasing elements respectively disposed adjacent to said first and second end surfaces of said magnetoresistive layer for providing a longitudinal bias thereto.

13. The magnetoresistive device of claim 12 further comprising:

first and second separation layers respectively interposed between said first and second longitudinal biasing elements and said first and second end surfaces of said magnetoresistive layer.

14. The magnetoresistive device of claim 13 wherein said first and second separation layers comprise a dielectric material.

15. The magnetoresistive device of claim 14 wherein said dielectric material comprises aluminum oxide.

16. The magnetoresistive device of claim 13 wherein said first and second separation layers comprise a non-magnetic metal.

17. The magnetoresistive device of claim 16 wherein said non-magnetic metal comprises Cr.

18. The magnetoresistive device of claim 12 wherein said first and second longitudinal biasing elements comprise CoPt, CoPtCr or CoPtTa.

19. The magnetoresistive device of claim 11 wherein said magnetoresistive layer comprises NiFe.

20. The magnetoresistive device of claim 11 wherein said magnetoresistive structure includes an elongated soft adjacent layer underlying said magnetoresitive layer and said first and second longitudinal biasing elements.

21. The magnetoresistive device of claim 20 wherein said soft adjacent layer comprises NiFeMo.

22. The magnetoresistive device of claim 20 wherein said magnetoresistive structure includes an elongated magnetic spacing layer overlying said soft adjacent layer.

23. The magnetoresistive device of claim 22 wherein said magnetic spacing layer comprises Ta.

24. The magnetoresistive device of claim 11 wherein said first medial edge is substantially 5 $\mu$ in length.

25. The magnetoresistive device of claim 24 wherein said displaced distance is substantially between 10–20 $\mu$.

26. The magnetoresistive device of claim 11 further comprising:

a head disk assembly;

at least one magnetic storage media rotatably contained within said head disk assembly having data encodable thereon; and at least one positioner mechanism movably contained within said head disk assembly for positioning said magnetoresistive device with respect to said storage media to enable reading of selected portions of said data.

27. A magnetic sensor comprising:

a planar magnetoresistive layer having a centrally located active region with a height dimension;

said magnetoresistive layer having first and second ends;

at least one planar electrical conductor occupying a plane that directly overlies said plane of said magnetoresistive layer;

said at least one conductor having a proximal edge that physically overlies one end of said active region, extends parallel to said height dimension, and is electrically coupled to said one end of said active region;

said at least one conductor having a distal edge;

said distal edge being displaced from said proximal edge in a direction away from said one end of said active region;

said proximal and distal edges being non-colinear;

said proximal edge being equal in length to said height of said active region; and said distal edge being displaced from said proximal edge by a distance that is at least twice said height of said active region.

28. The magnetic sensor of claim 27 further comprising:

first and second longitudinal biasing elements respectively disposed adjacent to said first and second ends of said magnetoresistive layer for providing a longitudinal bias thereto.

29. The magnetic sensor of claim 28 further comprising:

first and second separation layers respectively interposed between said first and second longitudinal biasing elements and said first and second ends of said magnetoresistive layer.

30. The magnetic sensor of claim 29 wherein said first and second separation layers comprise a dielectric material.

31. The magnetic sensor of claim 30 wherein said dielectric material comprises aluminum oxide.

32. The magnetic sensor of claim 29 wherein said first and second separation layers comprise a non-magnetic metal.

33. The magnetic sensor of claim 32 wherein said non-magnetic metal comprises Cr.

34. The magnetic sensor of claim 28 wherein said first and second longitudinal biasing elements comprise CoPt, CoPtCr or CoPtTa.

35. The magnetic sensor of claim 27 wherein said magnetoresistive layer comprises NiFe.

36. The magnetic sensor of claim 27 including a soft adjacent layer underlying said magnetoresistive layer.

37. The magnetic sensor of claim 36 wherein said soft adjacent layer comprises NiFeMo.

38. The magnetic sensor of claim 36 including a magnetic spacing layer located intermediate said soft adjacent layer and said magnetoresistive layer.

39. The magnetic sensor of claim 38 wherein said magnetic spacing layer comprises Ta.

40. The magnetic sensor of claim 27 wherein said proximal edge is substantially 5 $\mu$ in length.

41. The magnetic sensor of claim 40 wherein said displaced distance is substantially between 10–20 $\mu$.

42. The magnetic sensor of claim 27 further comprising:

a head disk assembly;

at least one magnetic storage media rotatably contained within said head disk assembly having data encodable thereon; and at least one positioner mechanism movably contained within said head disk assembly for positioning said magnetic sensor with respect to said storage media to enable reading of selected portions of said data.

\* \* \* \* \*